United States Patent
Nevet et al.

(10) Patent No.: US 9,621,864 B2
(45) Date of Patent: Apr. 11, 2017

(54) SPECTRAL IMAGING SYSTEM

(71) Applicant: Microsoft Technology Licensing, LLC, Redmond, WA (US)

(72) Inventors: Amir Nevet, Haifa (IL); Erez Tadmor, Tel Aviv (IL)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/154,643

(22) Filed: Jan. 14, 2014

(65) Prior Publication Data
US 2015/0201174 A1   Jul. 16, 2015

(51) Int. Cl.
| | |
|---|---|
| *H04N 9/77* | (2006.01) |
| *H04N 5/345* | (2011.01) |
| *H04N 3/14* | (2006.01) |
| *H04N 9/11* | (2006.01) |
| *H04N 9/04* | (2006.01) |
| *H04N 13/00* | (2006.01) |
| *H04N 13/02* | (2006.01) |
| *H04N 5/372* | (2011.01) |
| *H04N 5/374* | (2011.01) |

(Continued)

(52) U.S. Cl.
CPC .......... *H04N 9/77* (2013.01); *H01L 27/1469* (2013.01); *H01L 27/14647* (2013.01); *H04N 3/1556* (2013.01); *H04N 5/3454* (2013.01); *H04N 5/372* (2013.01); *H04N 5/374* (2013.01); *H04N 9/045* (2013.01); *H04N 9/11* (2013.01); *H04N 13/0022* (2013.01); *H04N 13/0203* (2013.01); *G06T 2200/04* (2013.01); *G06T 2219/2012* (2013.01); *H04N 2013/0077* (2013.01); *H04N 2013/0081* (2013.01); *H04N 2101/00* (2013.01); *H04N 2209/042* (2013.01); *H04N 2213/005* (2013.01)

(58) Field of Classification Search
CPC . H04N 9/11; H04N 5/374; H04N 9/77; H04N 9/045; H04N 13/0022; H04N 13/0203; H04N 5/372; H04N 5/3454; H04N 3/1556; H04N 2213/005; H04N 2013/0077; H04N 2013/0081; H01L 27/1469; H01L 27/14647
See application file for complete search history.

(56) References Cited

U.S. PATENT DOCUMENTS 5,113,076 A * 5/1992 Schulte ............... H01L 27/1446
                                                                250/330
5,233,429 A    8/1993 Jung
(Continued)

FOREIGN PATENT DOCUMENTS

| EP | 1469521 A2 | 10/2004 |
| EP | 1551061 A2 | 7/2005 |

OTHER PUBLICATIONS

"International Search Report & Written Opinion for PCT Application No. PCT/US2014/072620", Mailed Date: Apr. 2, 2015, 11 Pages.

*Primary Examiner* — Mekonnen Gagnew
(74) *Attorney, Agent, or Firm* — A.C. Entis-IP Ltd.

(57) ABSTRACT

An embodiment of the invention provides a spectral imager for imaging a scene comprising a semiconductor photosensor comprising light sensitive pixels and a power source that applies voltage to the photosensor to control responsivity of the pixels to light incident on the pixels in different wavelengths bands of light.

21 Claims, 3 Drawing Sheets

(51) Int. Cl.
*H01L 27/146* (2006.01)
*H04N 101/00* (2006.01)

(56) References Cited

U.S. PATENT DOCUMENTS

| | | | |
|---|---|---|---|
| 6,359,274 B1 | 3/2002 | Nixon et al. | |
| 6,713,796 B1 | 3/2004 | Fox | |
| 7,276,749 B2 | 10/2007 | Martin et al. | |
| 8,338,868 B2 | 12/2012 | Mheen et al. | |
| 2004/0195509 A1* | 10/2004 | Sundaram | B82Y 20/00 250/338.1 |
| 2005/0017245 A1 | 1/2005 | Manabe et al. | |
| 2006/0181626 A1* | 8/2006 | Lee | 348/308 |
| 2010/0013979 A1* | 1/2010 | Golub et al. | 348/340 |
| 2010/0252716 A1* | 10/2010 | Kalevo | G01J 1/46 250/208.1 |
| 2014/0246761 A1* | 9/2014 | Veeramma | 257/653 |
| 2014/0264270 A1* | 9/2014 | Dutta | H01L 27/14636 257/14 |

* cited by examiner

US 9,621,864 B2

SPECTRAL IMAGING SYSTEM

TECHNICAL FIELD

Embodiments of the invention relate to apparatus and methods for determining spectral content of light from a scene.

BACKGROUND

Cameras that acquire color images of a scene typically comprise optics that image light from the scene during an exposure period on a semiconductor photosensor having an array of pixels that register light in red (R), green (G), and blue (B) wavelength bands of the visible spectrum. Pixels in the array are generally arrayed in rows and columns and the photosensor may be any of various types of CCD (charge coupled device) or CMOS (complementary metal oxide on silicon) photosensors.

A pixel in the photosensor registers light from a region of the scene imaged on the pixel by the camera optics by accumulating electrons or holes from electron-hole pairs generated in the pixel by the incident light. The electron-hole pairs are generated in or near a depletion region of the pixel formed at a p-n junction, also referred to as a photodiode, of a p-doped semiconductor material and an n-doped semiconductor material. A p-doped semiconductor material is a material that is doped with acceptor atoms which provide the material with "holes" that attract electrons and function as positive charge carriers in the material. An n-doped semiconductor material is a material that is doped with donor atoms that contribute electrons to the material that are negative charge carriers in the material. A doping structure of the semiconductor material comprised in the photosensor determines whether pixels in the photosensor accumulate electrons or holes generated by light incident on the pixels. Usually pixels accumulate electrons, conventionally also referred to as photoelectrons, originating from electron-hole pairs to register incident light.

Towards the end of the exposure period, electric charge, also referred to as photocharge, associated with the electrons or holes accumulated in the pixel is used to generate a voltage or current signal. The signal provides a measure of an amount of the photocharge and thereby of the number of accumulated electrons or holes and intensity of R, G, or B light incident on the pixel that generated the electrons or holes. The measures of R, G, and B light provided by the pixels in the photosensor are used to provide a color image of the scene.

The depletion region of a pixel is capable of generating electron-hole pairs responsive to light having wavelengths in a relatively wide band of wavelengths. Typically the wavelength band includes light in the visible spectrum and infrared (IR) light. The visible spectrum comprises light having wavelengths in a band of wavelengths extending from about 380 nanometers (nm) to about 750 nm. R, G and B light comprise light in overlapping wavelength bands having widths equal to about 150 nm centered on wavelengths of 660 nm, 530 nm, and 440 nm respectively. Near IR (NIR) light has wavelengths in a wavelength band extending from about 800 nm to about 2,500 nm. An R, G, or B pixel is configured to distinguish between R, G, or B light, by a bandpass filter which shields the pixel so that substantially only R, G, and B light respectively in light imaged on the pixel enters the pixel to generate electron-hole pairs in the pixel's depletion region. An IR pixel is shielded by an IR bandpass filter.

Some special purpose cameras, may image a scene responsive to non-visible light. For example, three dimensional (3D) range cameras which provide range images that provide distances to features in a scene, may image the scene responsive to non-visible light such as IR. Some 3D range cameras provide in addition to a range image acquired responsive to IR light an R, G, and B color image of the scene.

SUMMARY

An aspect of an embodiment of the invention relates to providing a photosensor system, hereinafter also referred to as a "spectral imager", for imaging a scene responsive to light from the scene in different wavelength bands of light. The spectral imager comprises a semiconductor photosensor comprising light sensitive pixels and a power source that applies voltage to the photosensor to control registration of light from the scene in different wavelength bands of light.

In an embodiment of the invention, each pixel comprises first and second p-n junctions that define first and second photodiodes in the pixel and are characterized by depletion regions that respectively produce electric fields in opposite directions. The oppositely directed electric fields, depending on their polarity, produce a potential well for accumulating photoelectrons or holes provided by electron-hole pairs that light incident on the pixel generates. The power source applies voltage to an electrode in the photosensor that controls a location of the potential well in the pixel below a top surface of the pixel. The top surface is a surface of the photosensor at which light that the pixel registers enters the pixel. Location of the potential well relative to the top surface is measured as a distance from the top surface to a maximum or "peak" in electrostatic potential, hereinafter a "bounding potential peak", in the pixel farthest from the top surface that bounds the potential well.

Responsivity of a pixel to incident light, which may be defined as a ratio of signal strength produced by the pixel to intensity of light incident on the pixel, increases with distance of the potential well from the top surface more for light of longer wavelengths than for light of shorter wavelengths. As a result, changing the distance of the potential well in the pixel from the top surface in accordance with an embodiment of the invention changes wavelength bands of light to which the pixel is sensitive and for which the pixel registers light. Hereinafter "location depth", "d", is used to refer to a distance of a feature in a pixel below the top surface of the pixel and a location of a potential well in a pixel may be referred to as a location depth of the potential well in the pixel.

Let the location depth of a given potential well generated by the first and second p-n junctions and its bounding potential peak in a pixel be represented by $d_M$. Let responsivity of an i-th pixel $p_i$ of the photosensor to incident light for a given $d_M$ of the well and a given wavelength "λ" be represented by $R(i,d_M,\lambda)$. Optionally, responsivities of pixels in the photosensor is the same for all pixels, and assuming for simplicity that they are, responsivity of a pixel may be written without the index i, as $R(d_M,\lambda)$. Let intensity of light at wavelength λ incident on the i-th pixel $p_i$ be represented by $I(i,\lambda)$ and let signals generated by pixel $p_i$ responsive to $I(i,\lambda)$ be represented by $MI(i,d)$.

In an embodiment of the invention, the spectral imager power source applies a plurality of "N" different voltages to pixels of the photosensor to acquire measurements of incident light on the pixels for corresponding different location depths $d_{M,n}$, $0 \leq n \leq N$ of the potential wells in the pixels. Let the N signals MI(i,d) for light incident on the i-th pixel for location depths $d_{M,n}$, be represented by a vector MI(i,$d_n$) where a component MI(i,$d_n$) of the vector is a signal generated by the pixel for a location depth $d_{M,n}$. Assume that the spectrum of light incident on pixel $p_i$ is represented by a histogram of light intensities for K spectral bins having spectral width Δλ and central wavelengths represented by $\lambda_k$, 0≤k≤K. Let the intensities be represented by a vector I(i,$\lambda_k$) where a component I(i,$\lambda_k$) of the vector is an average intensity of light incident on pixel $p_i$ in the k-th bin. A responsivity matrix R($d_{M,n}$,$\lambda_k$) may be defined that relates the incident spectrum vector I(i,$\lambda_k$) to measurement vector MI(i,$d_n$) in accordance with an equation, $$MI(i,d_i)=R(d_{M,n},\lambda_k)\times I(i,\lambda_k). \quad (1)$$

In an embodiment of the invention equation (1) is solved to determine the vector I(i,$\lambda_k$) and provide a discrete spectrum of light incident on pixel $p_i$. Optionally, the light incident on pixel $p_i$ is visible light and the solution for I(i,$\lambda_k$) determines a color of light incident on the pixel.

In the discussion, unless otherwise stated, adverbs such as "substantially" and "about" modifying a condition or relationship characteristic of a feature or features of an embodiment of the invention, are understood to mean that the condition or characteristic is defined to within tolerances that are acceptable for operation of the embodiment for an application for which it is intended. Unless otherwise indicated, the word "or" in the specification and claims is considered to be the inclusive "or" rather than the exclusive or, and indicates at least one of, or any combination of items it conjoins.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF FIGURES

Non-limiting examples of embodiments of the invention are described below with reference to figures attached hereto that are listed following this paragraph. Identical features that appear in more than one figure are generally labeled with a same numeral in all the figures in which they appear. A label labeling an icon representing a given feature of an embodiment of the invention in a figure may be used to reference the given feature. Dimensions of components and features shown in the figures are chosen for convenience and clarity of presentation and are not necessarily shown to scale.

DETAILED DESCRIPTION

Figure 1:
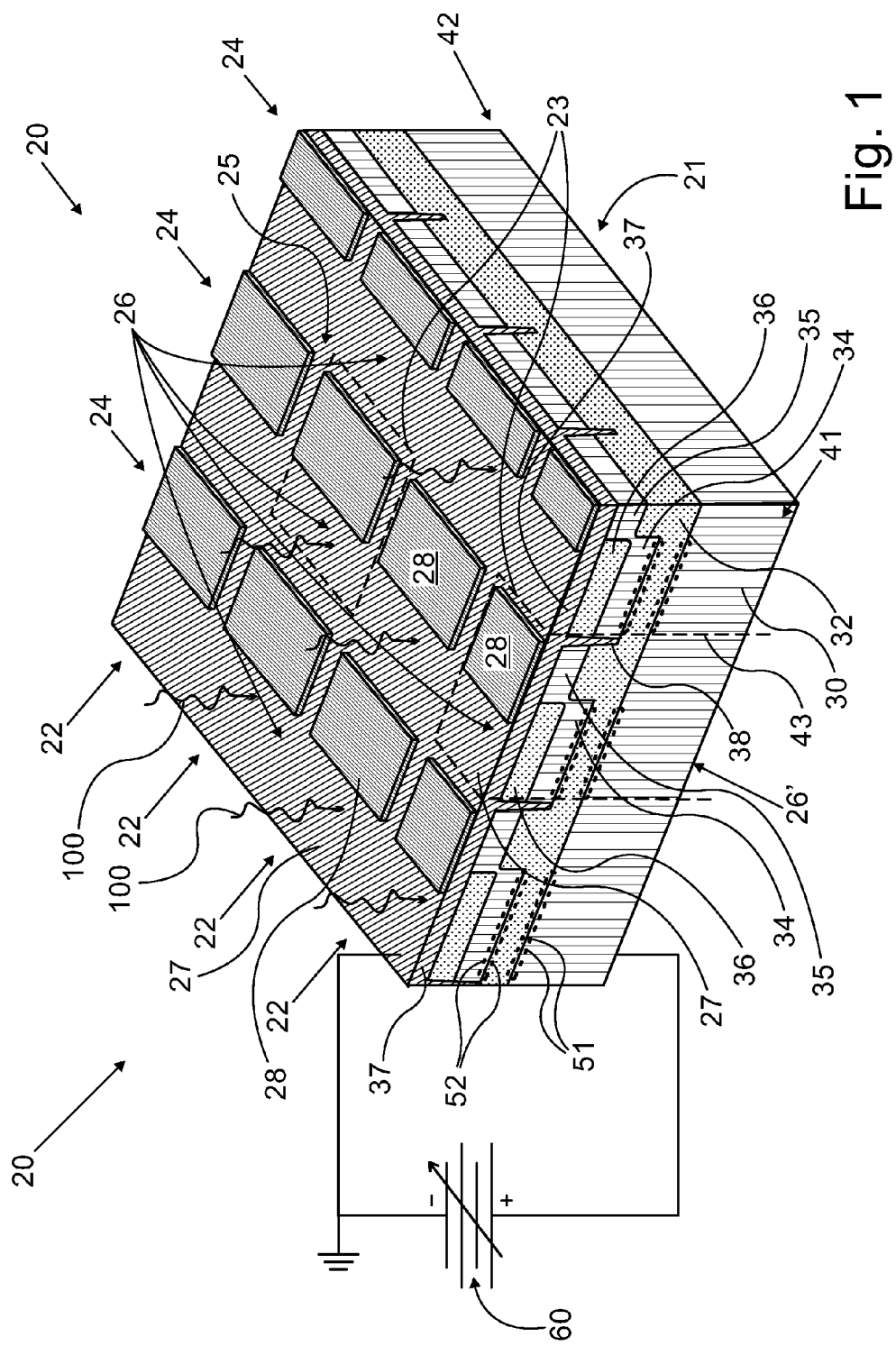
FIG. 1 schematically shows a spectral imager comprising a photosensor and power source, in accordance with an embodiment of the invention.

FIG. 1 schematically shows a spectral imager 20 for imaging a scene (not shown) responsive to light, represented by wavy arrows 100, from the scene in different wavelength bands, in accordance with an embodiment of the invention. Spectral imager 20 comprises a photosensor 21 having pixels 26, optionally arrayed in rows 22 and columns 24 of pixels and a power source 60. Power source controls voltage to the photosensor to control sensitivity of pixels 26 to light and wavelength bands of light for which they register light. Two pixels 26 are distinguished by a dashed border line 23. The border line demarks an area that a pixel 26 occupies on a top surface 25 of photosensor 21 that receives light 100 from the scene to provide an image of the scene.

Only a portion of photosensor 21 is shown in FIG. 1, and the portion is cutaway along surfaces 41 and 42. Surface 41 passes through and substantially bisects pixels 26 in a row 22 of pixels and shows a cross section of the pixels that exhibits details of internal features of photosensor 21 and pixels 26 along the row of pixels. For convenience of presentation, a pixel 26 bisected by surface 41 and associated with dashed border 23 on surface 25 is distinguished by a dashed border 43 on surface 41 and a label 26'. Surface 42 passes through pixels 26 in a column 24 of pixels 26 and shows a cross section of the pixels that exhibits details of internal structure of photosensor 21 and pixels 26 along the column of pixels.

Each pixel 26 comprises an "entrance area" 27 on top surface 25 through which light 100 incident on the pixel may enter the pixel to generate photocharge that the pixel registers to determine intensity of the incident light. Each pixel also comprises an electrode 28, also referred to as a transfer gate, which generally is opaque to light that pixel 26 registers. Transfer gate 28 may be electrified to transfer photocharge generated in pixel 26 by incident light 100 to a storage region of the pixel. Photocharge transferred to the storage region is processed to provide a current or voltage signal that provides a measure of the amount of photocharge accumulated by the pixel and thereby a measure of intensity of light incident on the pixel. Storage regions for pixels 26 are discussed below in the discussion of details of the structure of pixels 26.

Various features and configurations of features of photosensor 21, such as transistors that control signal generation and pixel resetting, transfer gates in addition to transfer gate 28 that might be used to transfer charge in a storage region to a readout transistor, or row and column select lines that are used to control which pixels are selected for "reading", are not shown in the figures.

Photosensor 21 is assumed by way of example to be a CMOS photosensor comprising a doping structure that configures pixels 26 in the photosensor to register incident light by accumulating photoelectrons rather than holes. The photosensor optionally comprises a heavily n-doped silicon substrate 30 on which a lightly p-doped silicon layer 32 is formed. N-doped regions 34 and 35, hereinafter also referred to as n-regions 34 and 35, are formed in p-doped epitaxial layer 32. A p-doped region 36 overlays n-doped region 34. N-region 35 is adjacent p-doped region 36 and is continuous with n-region 34. A top layer 37 of an electrically insulating material transparent to light that is imaged by spectral imager 20 protects underlying layers and features of photosensor 21. Trenches 38 filled with the oxide material in top layer 37 electrically isolates adjacent pixels 26 from each other.

In each pixel 26 a p-n junction, shown bracketed by dashed lines 51, where substrate 30 and layer 32 in the pixel interface, form a first photodiode of the pixel. The p-n junction region between and the first photodiode formed by the p-n junction may be referenced by numeral 51 labeling the dashed lines bracketing the p-n junction. A p-n junction region, bracketed by dashed lines 52, in each pixel 26 at an interface between layer 32 and n-doped region 34 in the pixel form a second photodiode in the pixel. The p-n junction between layer 32 and n-region 34 and the second photodiode formed by the p-n junction may be referenced by numeral 52 labeling the dashed lines bracketing the p-n junction.

N-region 35 in each pixel 26 functions as a storage region, and may be referred to as storage region 35, for photoelectrons generated in photodiodes 51 and 52 of the pixel by light 100 incident on entrance area 27 of the pixel. A positive voltage applied to transfer gate 28 operates to draw photoelectrons formed in photodiodes 51 and 52 into storage region 35 of the pixel. Photoelectrons transferred to storage region 35 are processed using any of various methods and devices known in the art to generate a signal that provides a measure of an amount of photoelectrons generated in the pixel and thereby intensity of light incident on the pixel.

By way of a numerical example, in an embodiment of the invention silicon substrate layer 30 may be n-doped by donor impurity atoms such as Phosphorous (P), Arsenic (As), and Antimony (Sb) to a concentration between about $10^{16}$ cm$^{-3}$ and about $10^{19}$ cm$^{-3}$ Layer 32 may be about 5 μm-20 μm (micrometers) thick and be lightly p-doped with acceptor impurity atoms such as Boron (B), Aluminum (Al), Gallium (Ga), and Indium (In) at a concentration of between about $10^{13}$ cm$^{-3}$ and about $10^{15}$ cm$^{-3}$. N-region 34 may be about 1 μm thick and doped with donor impurity atoms at a concentration between about $10^{15}$ cm$^{-3}$ and about $10^{17}$ cm$^{-3}$. P-layer 36 overlaying n-region 34 is optionally less than 0.1 μm thick and doped with acceptor impurities to a concentration between about $10^{18}$ cm$^{-3}$ and about $10^{20}$ cm$^{-3}$. Storage region 35 (region 35) may be between about 0.25 μm thick and 0.5 μm thick and doped with acceptor impurities to a concentration between about $10^{16}$ cm$^{-3}$ and about $10^{18}$ cm$^{-3}$. Layer 37 may be formed from an oxide material such as SiO$_2$ (silicon dioxide) and have a thickness between about 10 Å and 300 Å.

In an embodiment of the invention, power source 60 applies different voltages to substrate 30 of photosensor 21 to back bias photodiode 51 and configure electrostatic potential in pixels 26 as a function of location depth d in the pixels and control location depths of potential wells in the pixels that trap and accumulate photoelectrons.

Figure 2:
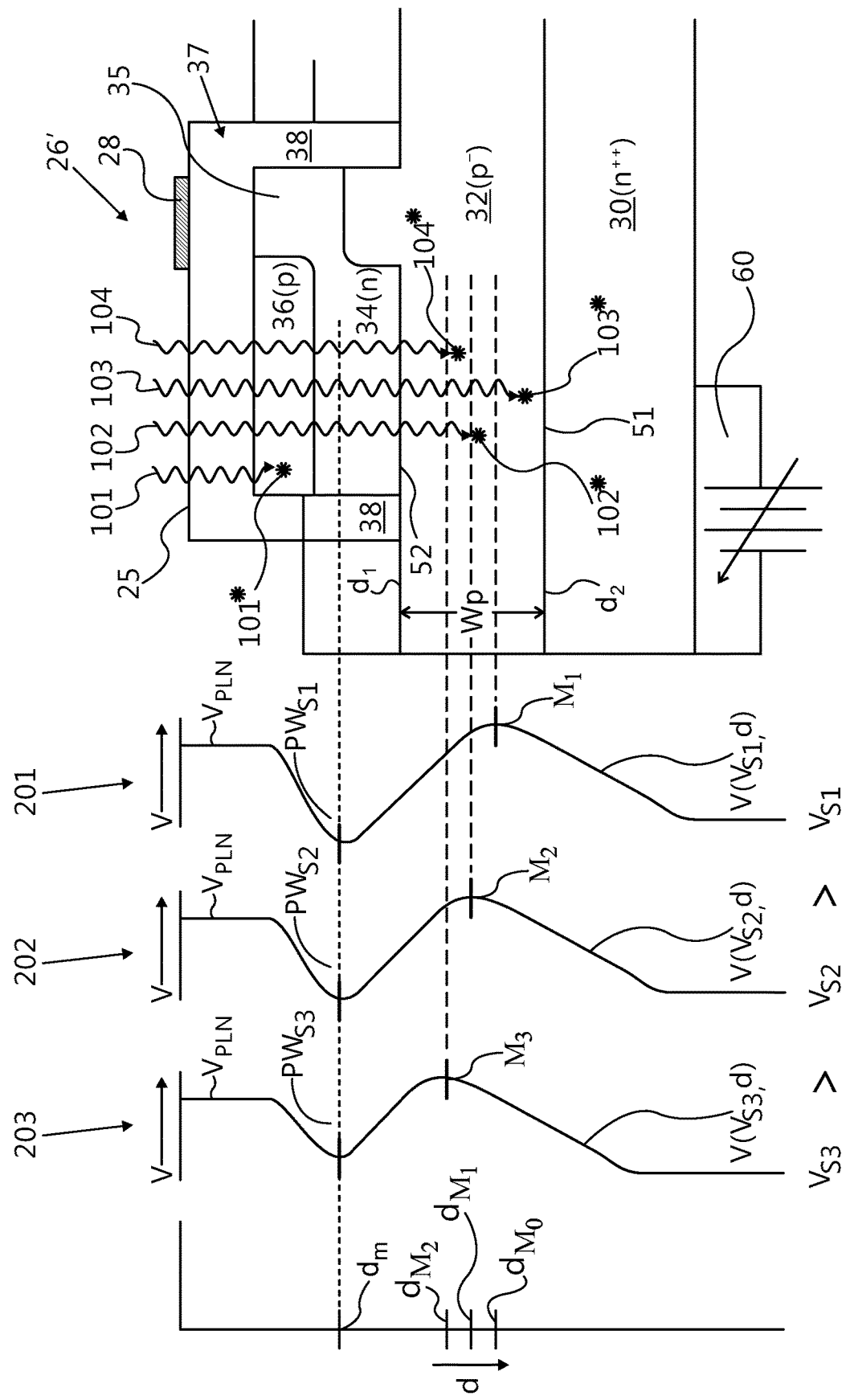
FIG. 2 schematically illustrates how location depth of a potential well in a pixel of the spectral imager shown in FIG. 1 changes with voltage that the power source applies to the photosensor, in accordance with an embodiment of the invention.

For a given voltage $V_S$ generated by power source 60 relative to a voltage at which oxide layer 37 and p-doped regions 36 are grounded, let the electrostatic potential for photoelectrons in a pixel 26 as a function of location depth d in the pixel measured from top surface 25 be represented by $V(V_S,d)$. FIG. 2 schematically illustrates $V(V_S,d)$ for pixel 26' shown in FIG. 1 for $V_S$ equal to $V_{S1}$, $V_{S2}$, and $V_{S3}$ for which $V_{S1}$, $<V_{S2}$, $<V_{S3}$. A cross section of pixel 26' is schematically shown enlarged on the right side of FIG. 2. On the left side of pixel 26' are graphs 201, 202, and 203 that show potential curves that trace values for $V(V_{S1},d)$ $V(V_{S2},d)$, and $V(V_{S3},d)$ as a function of location depth d. Location depth d in pixel 26' for graphs 201, 202, and 203 and for features of pixel 26' are indicated along a common axis of the graphs labeled "d". Magnitude in arbitrary units of potential represented by the potential curve in each graph is indicated along an axis labeled "V" associated with the graph.

Potentials $V(V_{S1},d)$, $V(V_{S2},d)$, $V(V_{S3},d)$ exhibit a substantially same potential plateau, $V_{PLN}$, in oxide layer 37 and p-doped region 36 at a pinning voltage of power source 60 and potential wells $PW_{S1}$, $PW_{S2}$, and $PW_{S3}$ having minima located at substantially a same location depth $d=d_m$ in n-doped region 34. Maxima M1, M2, and M3, in potentials $V(V_{S1},d)$, $V(V_{S2},d)$, $V(V_{S3},d)$ are bounding potential peaks for wells $PW_{S1}$, $PW_{S2}$, and $PW_{S3}$. Whereas bounding potential peaks M1, M2, and M3 are all located in epitaxial layer 32 they are located at different location depths $d_{M1}$, $d_{M2}$, and $d_{M3}$, in the epitaxial layer.

Let layer 32 between p-n junctions 51 and 52 have thickness $W_p$ and let the junctions, as indicated in FIG. 2 be located at location depths $d_1$ and $d_2$ so that $d_2=d_1+W_p$. If a location depth in p-doped layer 32 between $d_1$ and $d_2$ is represented by $d_1+x$, for $0 \le x \le W_p$, electrostatic potential $V(V_S,d)$ in the p-doped layer may be represented by $V(V_S,x)$ and approximated by an expression:

$$V(V_S,x) = V_o(2x/x_o - (x/x_o)^2) - xV_S/W_p. \quad (2)$$

In expression (2), $V_o$ is a maximum magnitude of $V(V_S,x)$ in p-doped layer 32 and $x_o$ is a location of the maximum magnitude in the layer for $V_S$ equal to zero. $V_o$ is therefore a bounding potential peak of a potential well associated with $V(V_S,x)$ for $V_S=0$ and $(d_1+x_o)$ is a location depth of the bounding potential peak and the potential well.

For $V_S$ greater than zero, $V(V_S,x)$ has a maximum, and a bounding potential peak for a potential well associated with $V(V_S,x)$ that is located in epitaxial p-doped layer 32 at $x_M$ given by an expression:

$$x_M = x_o(1-(x_o/2W_p)(V_S/V_o)). \quad (3)$$

A magnitude of the maximum and bounding potential peak of an associated potential well of $V(V_S,x)$ has a value:

$$V(V_S,x_M) = 2V_o - (x_o V_S/W_p) \quad (4)$$

Expression (3) shows that $x_M$ is a monotonically decreasing function of $V_S$ and location depth of a potential well associated with potential $V(V_S,x)$ decreases and the potential well moves towards top surface 25 as $V_S$ increases. Expression (3) for $x_M$ is valid for $0 \le V_S \le (2V_o W_p/x_o)$. For $V_S = 2V_o W_p/x_o$, $x_M$ is equal to zero. In the range of validity of expression (3) as a function $V_S$, expression (4) indicates that $V(V_S,x_M)$ is also a monotonically decreasing function of $V_S$. As a result as $V_S$ increases, the potential well associated with $V(V_S,x)$ becomes shallower and disappears for $V_S \ge (2V_o W_p/x_o)$.

Potential curves $V(V_{S1},d)$ $V(V_{S2},d)$, and $V(V_{S3},d)$ in graphs 201, 202 and 203 schematically illustrate the behavior of potential $V(V_S,d)$ with increasing $V_S$. As voltage $V_S$ for the curves increase ($V_{S1}<V_{S2}<V_{S3}$) the curves exhibit a shallower potential well that is closer to top surface 25. For example, potential curve $V(V_{S2},d)$, has a bounding potential peak $M_2$ that is located at a distance $d_{M2}$ that is smaller than distance $d_{M1}$ for bounding potential peak $M_1$ in potential curve $V(V_{S1},d)$, and potential well PWS2 is shallower than PWS1.

Figure 3:
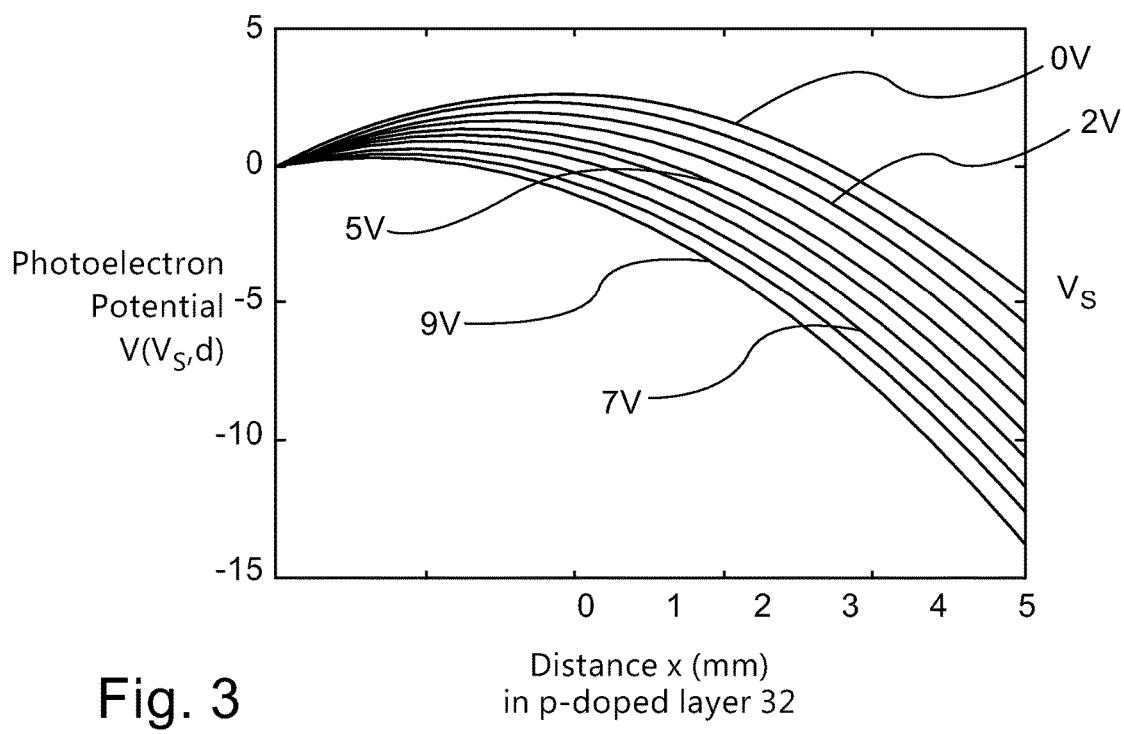
FIG. 3 shows curves for electrostatic potential for photoelectrons in a pixel of the spectral imager shown in FIG. 1 in accordance with an embodiment of the invention.

FIG. 3 shows curves for $V(V_S,x)$ calculated for $W_p=5$ μm, $x_o=2$ μm, and $V_o=3$ volts and voltage $V_S$ applied by power source 60 to substrate 30 from 0 volts to 10 volts in steps of 1 volt. As $V_S$ increases the peak in the potential $V(V_S,d)$ moves towards smaller values of x, and therefore smaller values of location depth d of the bounding potential peak, and the magnitude of the peak decreases and associated potential wells (not shown in FIG. 3) becoming shallower.

Referring back to FIG. 2, the figure schematically illustrates how decreasing location depth of the bounding potential peak affects registering photoelectrons generated by light incident on pixel 26'.

FIG. 2 schematically shows photons 101, 102, 103, and 104 that are absorbed in pixel 26' and respectively generate electron-hole pairs schematically indicated by asterisk labeled 101*, 102*, 103* and 104*. Photoelectrons from the electron-hole pairs drift in the direction of decreasing potential and holes from the electron-hole pairs drift in direction of increasing potential. (For convenience of exposition, potential is defined to increase for negative charge carriers.) As a result, photoelectrons from an electron-hole pair generated in a region of pixel 26' below plateau $V_{PLN}$ of a potential $V(V_S,d)$ in pixel 26' and above a location depth of the potential well in $V(V_S,d)$ determined from the location depth of its bounding potential peak will drift into the potential well. If the electron-hole pair is generated below the location depth of the bounding potential peak the photoelectron from the electron-hole pair will drift to the substrate layer 30 and recombine with a hole in the layer. If the electron-hole pair is generated in plateau $V_{PLN}$ it will tend to drift randomly until it recombines or drifts into the potential well. Holes from the electron-hole pair will drift away from the potential well and eventually recombine with electrons.

By way of example, electron-hole pair 101* is generated substantially in plateau $V_{PLN}$, which is substantially the same for all $V(V_{S1},d)$ $V(V_{S2},d)$, and $V(V_{S3},d)$. Therefore, substantially for substantially any $V_S$ in a range $V_{S1} < V_S < V_{S3}$, the photoelectron from the pair will drift randomly until it recombines or accidently gets trapped by a potential well of $V(V_S,d)$. On the other hand electron-hole pair 102* is generated below the location depth of potential wells $PW_{S2}$ and $PW_{S3}$ of $V(V_{S2},d)$ and $V(V_{S3},d)$. The photoelectron from electron-hole pair 102* will therefore drift to substrate layer 30 and not be collected by potential wells $PW_{S2}$ and $PW_{S3}$. However, were power source 60 to bias substrate layer 30 with voltage $V_{S1}$, the photoelectron would be collected in potential well $PW_{S1}$. Similarly, the photoelectron from electron-hole pair 103* would not be collected by any of potential wells $PW_{S1}$, $PW_{S2}$, and $PW_{S3}$, and the photoelectron from electron-hole pair 104* would be collected in potential well $PW_{S1}$, but not in $PW_{S2}$ or $PW_{S3}$.

In view of the above, it is seen that as voltage $V_S$ increases, an effective maximum location depth in pixel 26 for collecting photoelectrons provided by electron-hole pairs generated by light incident on the pixel decreases. As a result, as voltage $V_S$ increases sensitivity of the pixel to incident light decreases. However, sensitivity does not decrease at a same rate with voltage $V_S$ for light at all wavelengths. Shorter wavelengths of light have a larger absorption cross section in the material of pixel 26 and concomitantly shorter absorption length and larger absorption coefficient than light at longer wavelengths. On the average, shorter wavelengths of light do not penetrate as deep into a pixel 26 before they are absorbed and generate electron-hole pairs than longer wavelengths of light. Therefore, as $V_S$ increases responsivity of pixels 26 to light at longer wavelength decreases faster than responsivity of the pixels to shorter wavelengths of light.

Assuming the Beer-Lambert law, light incident on pixels 26 at wavelength λ attenuates exponentially with location depth d in pixels 26 as $e^{-\alpha(\lambda)d}$, where α(λ) is the absorption coefficient of light in the material of the pixels at wavelength λ. Assume that a maximum location depth for collection of photoelectrons in pixels 26 for a voltage $V_S$ is a location depth $d_M$ of the bounding potential peaks of the potential wells (for example, location depths $d_{M1}$, $d_{M2}$, and $d_{M3}$ for peaks labeled M1, M2 and M3 shown in FIG. 2) in the pixels for voltage $V_S$. Then responsivity of an i-th pixel 26 in photosensor at wavelength λ may be modeled in accordance with an expression:

$$R(d_M,\lambda)=\Phi(1-e^{-\alpha(\lambda)d_M}). \qquad (5)$$

In expression (5),Φ is a proportionality constant substantially independent of λ, and $d_M$ may be evaluated using expression (3) to provide:

$$d_M=d_1+x_M=d_1+x_o(1-(x_o/W_p)(V_S/V_o)), \qquad (6)$$

where $d_1$ is the location depth of p-n junction 52 (FIG. 2).

From expression (6), since for a given configuration of a photosensor, such as photosensor 21, $d_1$, $x_o$, and $V_o$ may be considered substantially constant, $d_M$ may be considered a function that changes substantially only as a result of change of $V_S$, and $R(d_M,\lambda)$ through dependence on $d_M$ may be considered dependent on $V_S$ and written as $R(V_S,\lambda)$.

Figure 4:
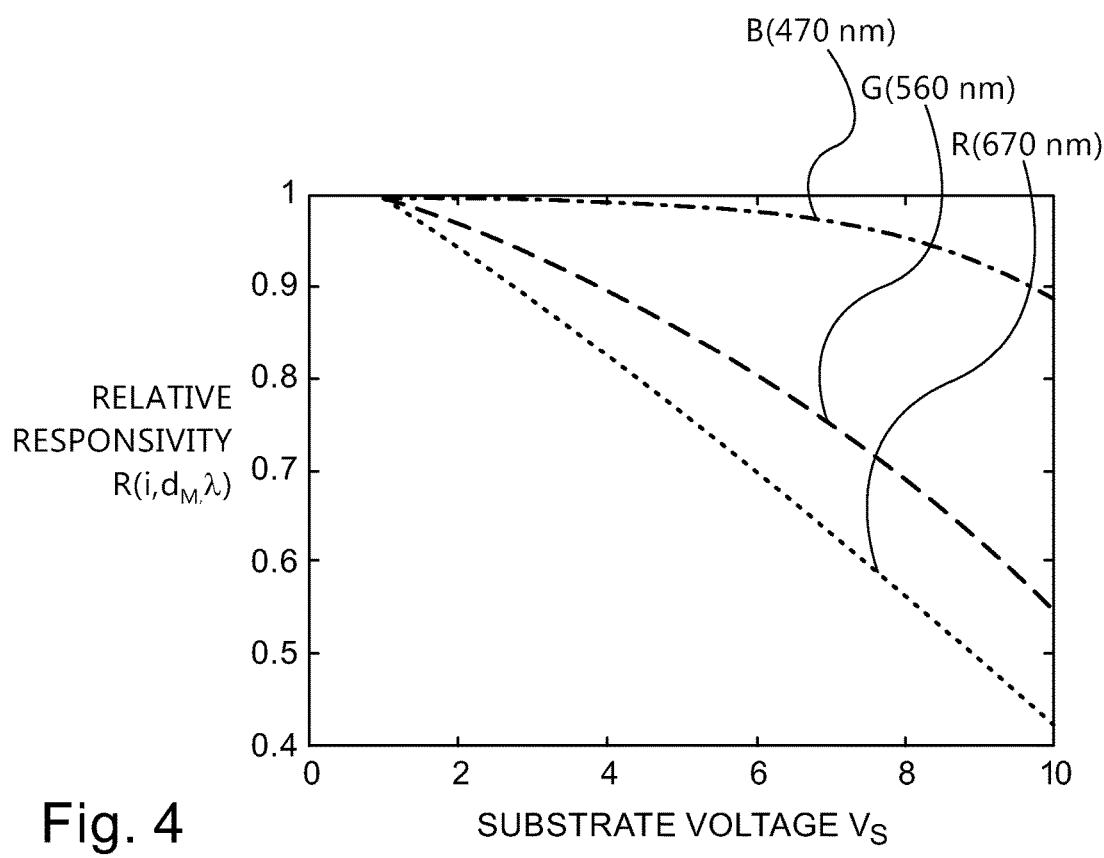
FIG. 4 shows curves of relative responsivity R($d_M$,λ) for R, G and B light as a function of voltage applied to a photosensor of a spectral imager, in accordance with an embodiment of the invention.

FIG. 4 shows a graph of responsivity $R(V_S,\lambda)$ evaluated in arbitrary units for R light at 670 nm, G light at 560 nm, blue light at 470 nm, $W_p=5$ μm, $x_o=2$ μm, and $V_o=3$ volts and normalized to a maximum responsivity at $V_S$ equal to about 1. The graph shows that responsivity of a pixel for R, G, and B decreases with increasing voltage $V_S$ (and thereby $d_M$) and that for the longer, R and G wavelengths of light, the decrease may be substantial. The graph also shows that for a same voltage $V_S$, responsivities $R(V_S,\lambda)$ of the pixel for R, G, and B light may be quite different.

Differences, such as shown in FIG. 4, in dependency of $R(V_S,\lambda)$ on voltage $V_S$ for different wavelengths of light may be used to provide a spectrum for light from a scene imaged on a spectral imager, such as spectral imager 20, in accordance with an embodiment of the invention. Optionally, the spectrum is used to provide a color image of the scene.

For example, spectral imager 20 (FIG. 1) may be comprised in a camera (not shown) having a collector lens for collecting light from the scene and optics for imaging the collected light on the spectral imager to provide a color image of the scene. Assume that responsivities of spectral imager 20 for R, G, and B light in bands of wavelengths having representative wavelengths of 670 nm, 560 nm, and 470 nm, and bandwidths of about 100 nm are given by the curves shown in FIG. 4. Assume further that the optics in the camera focuses or directs light to spectral imager 20 to acquire three images of the scene for which power source 60 applies voltages $V_{Sn}$, 1≤n≤3 respectively to photosensor 21. Then for each voltage $V_{Sn}$, FIG. 4 provides responsivity of pixels 26 in photosensor 21 for each of R, G, and B light. By way of example, from FIG. 4, if $V_{S2}$ ($V_{Sn}$ with n=2) were equal to about 5, responsivity of a pixel 26 in photosensor 21 would be about, 0.77, 0.85, and 0.99 for R, G, and B light respectively.

Let responsivity of pixels in photosensor 21 for R, G, and B and voltage $V_{Sn}$ be represented by $R(V_{Sn},\lambda_R)$, $R(V_{Sn},\lambda_G)$, and $R(V_{Sn},\lambda_B)$. Let intensity of the R, G, and B light incident on an i-th pixel 26, $p_i$, of photosensor 21 for the representative wavelengths and bandwidths noted above be represented by $I(i,\lambda_R)$, $I(i,\lambda_G)$, $I(i,\lambda_B)$. If measurements of current or voltage provided by pixel $p_i$, at voltage $V_{Sn}$ responsive to light incident on the pixel is represented by $MI(i,V_{Sn})$, the measurements and responsivities provide a set of three equations in the three unknowns of light intensity, $I(i,\lambda_R)$, $I(i,\lambda_G)$, $I(i,\lambda_B)$. The equations are:

$$MI(i, V_{S1}) = R(V_{S1}, \lambda_R)I(i, \lambda_R) + R(V_{S1}, \lambda_G)I(i, \lambda_G) + \\ R(V_{S1}, \lambda_B)I(i, \lambda_B)$$
$$MI(i, V_{S2}) = R(V_{S2}, \lambda_R)I(i, \lambda_R) + R(V_{S2}, \lambda_G)I(i, \lambda_G) + \\ R(V_{S2}, \lambda_B)I(i, \lambda_B)$$
$$MI(i, V_{S3}) = R(V_{S3}, \lambda_R)I(i, \lambda_R) + R(V_{S3}, \lambda_G)I(i, \lambda_G) + \\ R(V_{S3}, \lambda_B)I(i, \lambda_B)$$

or in vector and matrix notation similar to the notation of equation (1)

$$MI(i, V_{S3}) = R(V_{Sn}, \lambda_k) \times I(i, \lambda_k),$$

(7)

where bold italicized letters represent vectors and bold scripted $R(V_{Sn},\lambda_k)$ is a matrix of responsivities. Equation 7 may readily be solved by a processor (not shown) comprised in the spectral photosensor or camera for R, G, and B intensities $I(i,\lambda_R)$, $I(i,\lambda_G)$, $I(i,\lambda_B)$ of light incident on pixel $p_i$ and a color determined for a feature of the scene imaged on the pixel responsive to the intensities. A color image of the scene may be determined in accordance with an embodiment of the invention from the colors determined for a plurality of the pixels $p_i$ in photosensor 21 to provide the color image of the scene.

In the above description, a color image for the scene was provided responsive to light intensities $I(i,\lambda_R)$, $I(i,\lambda_G)$, $I(i,\lambda_B)$ in three different wavelength bands of light determined from three images of the scene acquired respectively at three different voltages $V_{Sn}$. However, practice of embodiments of the invention is not limited to determining intensities of light incident on pixels in three different wavelength bands responsive to three images acquired at respectively three different voltages $V_{Sn}$. A color image may be determined responsive to light intensities in "$\mathcal{N}$" wavelength bands of light where $\mathcal{N}$ may be substantially any number greater than 2. For example $\mathcal{N}$ may be 4 or 10.

Furthermore, a number N of images acquired at different voltages $V_{Sn}$ does not have to be equal to $\mathcal{N}$ as in the example given above for $\mathcal{N}$ equal to 3. N may be greater or less than $\mathcal{N}$, and the intensities may correspondingly be over determined or undetermined by the number of images. The intensities may be determined using any of various regression methods, such as by way of example, a method based on a least squares or Gaussian mixture model.

In addition, whereas pixels 26 in photosensor 21 are not shown shielded by bandpass filters, in an embodiment of the invention a spectral imager may comprise pixels shielded by a bandpass filter. A spectral imager in accordance with an embodiment of the invention may for example comprise pixels shielded by R, G, or B filters. A power source comprised in the spectral imager may set $V_{Sn}$ to control white balance by controlling sensitivity of the spectral imager to long wavelengths of light. For example, the power source may set $V_{Sn}$ to reduce sensitivity of the spectral imager to long wavelength of light from a scene for situations in which the scene is illuminated with incandescent light having excessive amounts of light at long wavelengths.

It is further noted that whereas photosensor 21 in spectral imager 20 is described as a CMOS photosensor, practice of embodiments of the invention is not limited to CMOS photosensors. A spectral imager in accordance with an embodiment of the invention may comprise a CCD photosensor and a power source that biases a substrate of the photosensor with voltage $V_S$ to control responsivity of pixels in the photosensor.

It is additionally noted that whereas power source 60 is indicated in the above description as applying substantially a same voltage substantially simultaneously to all pixels 26 in photosensor 21 to control responsivity of the pixels by biasing substrate 30 of the photosensor with $V_S$, a power source comprised in a spectral imager in an embodiment of the invention may bias different pixels in a photosensor with different voltages.

For example, a spectral imager in accordance with an embodiment of the invention may comprise a plurality of electrodes, each of which may be electrically biased by a power source independent of electrical biasing of others of the plurality of electrodes, to bias different photodiodes in the imager at different bias voltages. Photodiodes to be biased independently of each other may be formed in separate n-wells formed in a p-substrate. By biasing electrodes independently of each other, a power source may control responsivity of pixels in the photosensor independently of each other.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

Descriptions of embodiments of the invention in the present application are provided by way of example and are not intended to limit the scope of the invention. The described embodiments comprise different features, not all of which are required in all embodiments of the invention. Some embodiments utilize only some of the features or possible combinations of the features. Variations of embodiments of the invention that are described, and embodiments of the invention comprising different combinations of features noted in the described embodiments, will occur to persons of the art. The scope of the invention is limited only by the claims.

The invention claimed is:

1. A spectral imager for imaging a scene responsive to light from the scene, the imager comprising:
    a semiconductor photosensor comprising light sensitive pixels; and
    a power source configured to apply voltage to the photosensor to control width of a potential well in each pixel that traps charge carriers generated by light incident on the photosensor and thereby responsivity of the pixel to the incident light to control the pixel to register light in different wavelengths bands of light.

2. The spectral imager in accordance with claim 1 wherein:
    each of the pixels comprises first and second p-n junctions having depletion regions that generate electric fields in opposite directions and create the potential well in the pixel that traps the charge carriers generated by light incident on the pixel; and
    the pixel generates a signal indicative of intensity of light incident on the pixel responsive to charge of charge carriers trapped by the potential well.

3. The spectral imager in accordance with claim 2 wherein the charge carriers are photoelectrons.

4. The spectral imager in accordance with claim 2 wherein the charge carries are holes.

5. The spectral imager in accordance with claim 4 wherein the semiconductor comprises an n-doped semiconductor layer on which the p-n junctions are formed.

6. The spectral imager in accordance with claim 4 wherein the n-doped semiconductor layer is a substrate of the photosensor.

7. The spectral imager in accordance with claim 1 wherein the power source applies substantially a same voltage to each of the pixels substantially simultaneously.

8. The spectral imager in accordance with claim 1 wherein the power source applies voltage to at least two different pixels independently of each other to control responsivity of one of the at least two pixels independent of responsivity of the other of the at least two pixels.

9. The spectral imager in accordance with claim 1 wherein the photosensor is CCD (charge coupled device) photosensor.

10. The spectral imager in accordance with claim 1 wherein the photosensor is a CMOS (complimentary metal on silicon) photosensor.

11. The spectral imager in accordance with claim 1 wherein the power source applies a plurality of "N" different voltages to pixels of the photosensor to acquire N measurements of light from the scene incident on each pixel.

12. The spectral imager in accordance with claim 11 and comprising a processor that processes the N measurements responsive to responsivities of the pixel at different voltages of the N voltages to determine a spectrum for light incident on the pixel.

13. The spectral imager in accordance with claim 12 wherein the processor provides a solution to a set of simultaneous equations that are a function of the N measurements to determine the spectrum.

14. The spectral imager in accordance with claim 12 wherein the spectrum comprises values for light intensity for each of a plurality of $\mathcal{N}$ wavelength bins.

15. The spectral imager in accordance with claim 14 wherein N is equal to $\mathcal{N}$.

16. The spectral imager in accordance with claim 14 wherein N is not equal to $\mathcal{N}$.

17. The spectral imager in accordance with claim 1 wherein the processor determines a color for light incident on the pixel responsive to the spectrum.

18. A method of imaging a scene responsive to light from the scene, the method comprising:
   collecting light from the scene so that the light is incident on a semiconductor photosensor comprising light sensitive pixels that generate signals responsive to light incident on the pixels; and
   applying voltage to the photosensor to control width of a potential well in each pixel that traps charge carriers generated by light incident on the photosensor and thereby responsivity of the pixel to the incident light to control the pixel to register light in different wavelengths bands of light.

19. The method according to claim 18 and comprising applying a plurality of different voltages to pixels of the photosensor to acquire measurements of light from the scene incident on each pixel in a plurality of different wavelength bands.

20. The method according to claim 19 and processing the plurality of measurements to determine a spectrum for light incident on the pixel.

21. The method according to claim 20 and using the spectrum to determine a color for light incident on the pixel.

* * * * *